United States Patent

Oba et al.

[11] Patent Number: 6,154,371
[45] Date of Patent: Nov. 28, 2000

[54] PRINTED CIRCUIT BOARD ASSEMBLY AND METHOD

[75] Inventors: Glenn George Oba, Milpitas; Indrajit Rajeev Gajendran, Sunnyvale; Victor Vigdorchik, Belmont, all of Calif.

[73] Assignee: Cisco Technology, Inc., San Jose, Calif.

[21] Appl. No.: 09/163,971

[22] Filed: Sep. 30, 1998

[51] Int. Cl.[7] .................................................. H01L 23/12
[52] U.S. Cl. ........................ 361/764; 361/761; 257/723; 257/777
[58] Field of Search ................................. 361/761, 764; 257/723, 685, 686, 724, 777

[56] References Cited

U.S. PATENT DOCUMENTS

| | | | |
|---|---|---|---|
| 4,660,069 | 4/1987 | Kochanski et al. | 257/724 |
| 5,386,343 | 1/1995 | Pao | 361/761 |
| 5,412,538 | 5/1995 | Kikinis et al. | 361/761 |
| 5,608,262 | 3/1997 | Degani et al. | 257/723 |
| 5,615,089 | 3/1997 | Yoneda et al. | 361/764 |
| 5,631,497 | 5/1997 | Miyano et al. | 257/686 |
| 5,731,633 | 3/1998 | Clayton | 257/723 |
| 5,744,862 | 4/1998 | Ishii | 257/777 |
| 5,831,833 | 11/1998 | Shirakawa et al. | 361/764 |
| 5,943,216 | 8/1999 | Schmidt | 361/761 |

FOREIGN PATENT DOCUMENTS

| | | |
|---|---|---|
| 60-080232 | 5/1985 | Japan . |
| 7-030059 | 1/1995 | Japan . |

*Primary Examiner*—Jeffrey Gaffin
*Assistant Examiner*—John B. Vigushin
*Attorney, Agent, or Firm*—D'Alessandro & Ritchie

[57] ABSTRACT

A printed circuit board assembly incorporates an opening into which one or more integrated circuit packages at least partially fit, a plurality of electrical connection pads are disposed about the periphery of the opening, corresponding leads of the integrated circuit package are bonded to the pads, and the overall assembly is thinner than an assembly lacking the opening.

9 Claims, 4 Drawing Sheets

PRINTED CIRCUIT BOARD ASSEMBLY AND METHOD

BACKGROUND OF THE INVENTION

1. Field of the Invention

The present invention relates to electronic circuits, and more particularly to mounting integrated circuit packages to printed circuit boards.

2. The Background Art

Printed circuit boards and integrated circuits are well known. With reference to FIG. 1, in the past integrated circuit packages 10 and 12 have been connected by plural conductive leads 13 and 15, respectively, to electrical connecting pads 14 of a printed circuit board 16, either on one side only, or on both sides of the board 16, as shown. The leads 13 and 15 may be connected to the pads 14 by suitable means, such as by soldering. The currently preferred form of attachment is by Surface Mount Technology (SMT) which is well known to those of ordinary skill in the art.

In this configuration, the integrated circuit packages 10 and 12 project outwardly from the board 16. In many instances, it is desirable to place separate printed circuit boards closely together in a mother board/daughter board or similar configuration, since a high density of circuitry may be needed, and the projecting integrated circuit packages 10 and 12 obstruct such close placement of the boards 16.

BRIEF DESCRIPTION OF THE INVENTION

A printed circuit board assembly incorporates an opening into which at least one integrated circuit package at least partially fits. A plurality of electrical connection pads are disposed about the periphery of the opening. Corresponding leads of the integrated circuit package are bonded to the pads. The overall assembly is thinner than an assembly lacking the opening.

FEATURES AND ADVANTAGES OF THE INVENTION

A principal feature and advantage of the invention is the provision of an improved printed circuit board assembly.

Another feature and advantage of the invention is that the overall thickness of the printed circuit board assembly is reduced.

Yet another feature and advantage of the invention is that printed circuit board assemblies can be made much more compact in the thickness dimension than those of the prior art.

A further feature and advantage of the invention is that the integrated circuit package is more protected from damage than in accordance with the prior art.

A feature and advantage of the invention is that the assembly achieves high circuit density at little added cost.

These and many other features and advantages of the present invention will become apparent to those of ordinary skill in the art from a consideration of the drawings and ensuing description of the invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
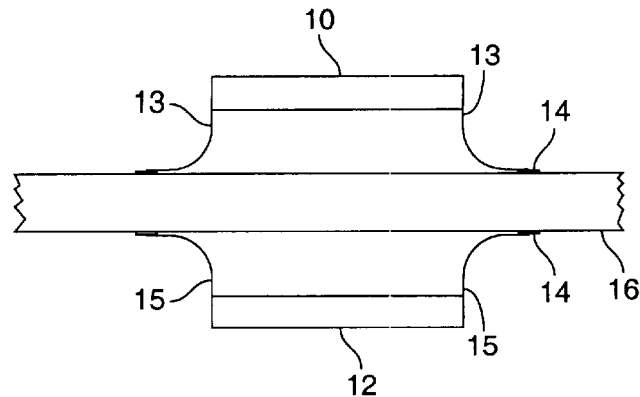
FIG. 1 is a diagrammatic view of a two sided multi-layer SMT printed circuit board with attached integrated circuit packages on each side in accordance with the prior art.
Figure 2:
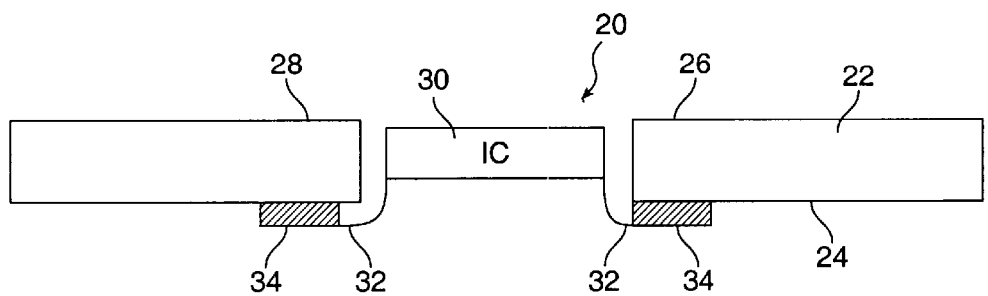
FIG. 2 is a diagrammatic view of a printed circuit board having an integrated circuit package at least partially embedded in an opening therein in accordance with a presently preferred embodiment of the present invention.
Figure 3:
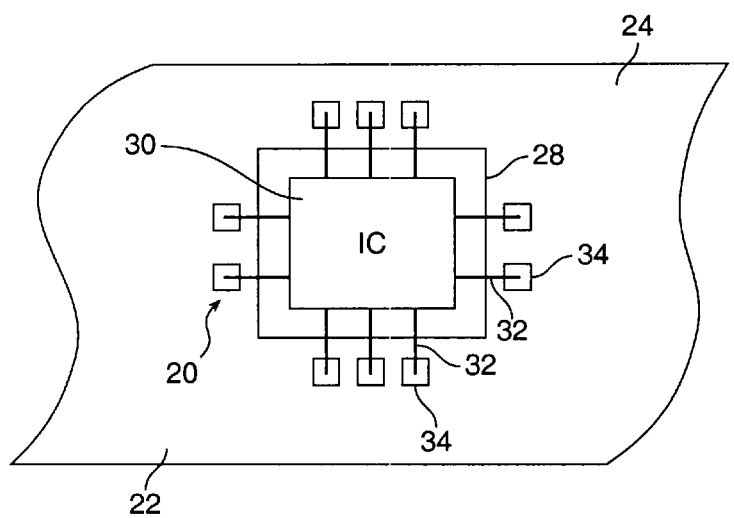
FIG. 3 is a plan view of the configuration shown in FIG. 2.

Referring now to FIGS. 2 and 3, there is shown an integrated circuit package generally designated 20 according to a presently preferred embodiment of the present invention. The package 20 is attached to a printed circuit board 22, such as a multi-layer board 22, having a pair of opposed outer surfaces 24 and 26, and an opening 28 formed in the board 22, and extending between the outer surfaces 24 and 26.

As shown, the dimensions of package are less than the dimensions of opening 28. Also, the thickness of the package may be (although it is not required to be) less than the thickness of board 22. Due to the relative dimensions, the package 20 which has an integrated circuit 30 is at least partially received in the opening 28, and also has a plurality of electrically conductive leads 32 being electrically connected to corresponding electrical connection pads 34 on the outer surface 24, with the pads 34 being disposed peripherally around the opening 28. The leads 32 may be connected to the pads 34 in any suitable manner, such as by soldering. As known to the art, the pads 34 are electrically connected to other circuits in the board 22.

In this configuration, the package 20 is recessed away from the position relative to surfaces 24 and 26 of the board 22 that it would assume without the benefit of opening 28, and thus the package 20 permits closer placement of more than one printed circuit board 22 than would the prior art. In addition, the package 20 is somewhat additionally protected from damage.

Figure 4:
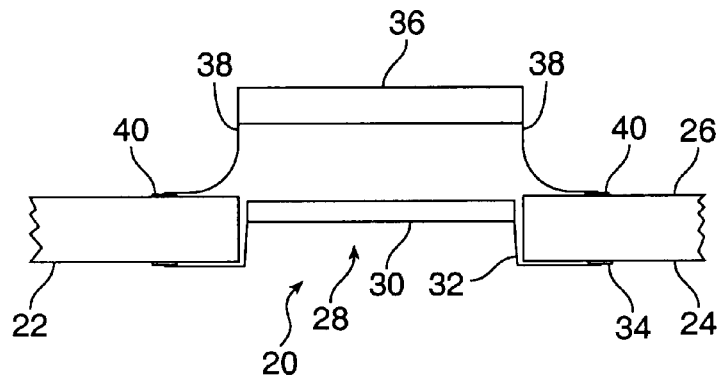
FIG. 4 is a diagrammatic view of another presently preferred embodiment of the present invention.

Another embodiment of the present invention is illustrated in FIG. 4, in which like reference numerals designate like parts. In this embodiment, a first package 20 and a second package 36 are both mounted near opening 28. Package 36 is electrically connected by leads 38 to corresponding connection pads 40 extending peripherally around the opening 28 on the other outer surface 26 of the printed circuit board 22. Thus, in this embodiment, the assembly may contain two integrated circuit packages 20 and 36 registered with the opening 28 of the board 22. One of the packages 20 is at least partially disposed in opening 28, and one 36 is mounted over opening 28. The result is a printed circuit board assembly that is thinner than one using conventional mounting techniques.

Figure 5:
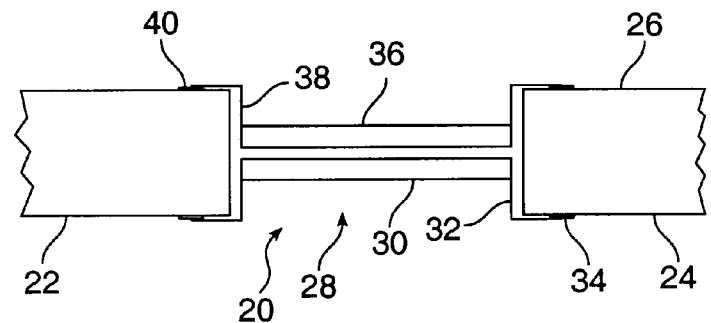
FIG. 5 is a diagrammatic view of yet another presently preferred embodiment of the present invention.

Another embodiment of the present invention is illustrated in FIG. 5, in which like reference numerals designate like parts. In this embodiment, the second integrated circuit package 36 is also disposed at least partially in the opening 28 intermediate the outer surfaces 24 and 26 of the printed circuit board 22, which permits more than one integrated circuit package to be at least partially recessed within the board 22. The result is a printed circuit board assembly that is thinner than one using conventional mounting techniques.

Figure 6:
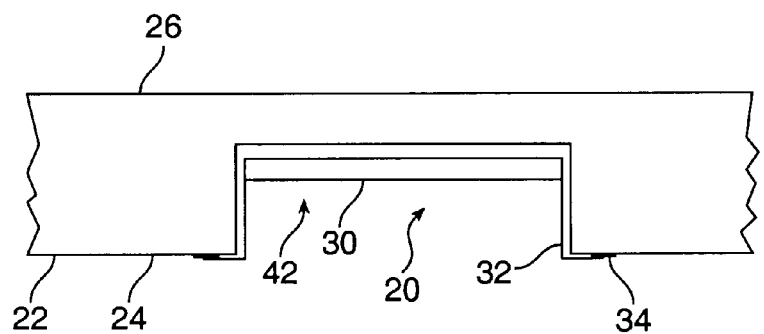
FIG. 6 is a diagrammatic view of yet another presently preferred embodiment of the present invention.

Another embodiment of the present invention is illustrated in FIG. 6, in which like reference numerals designate like parts. In this embodiment, the board 22 has a cavity 42 extending from one of the outer surfaces 24 or 26, such as the surface 24, of the board 22, but cavity 42 does not extend entirely through board 22. In this embodiment, one of the integrated circuit packages, such as the first integrated circuit package 20, is disposed at least partially within cavity 42 so as to be recessed from the corresponding outer surface 24 of the board 22 to make the board more compact, and somewhat protect the integrated circuit package 20 from damage.

Figure 8:
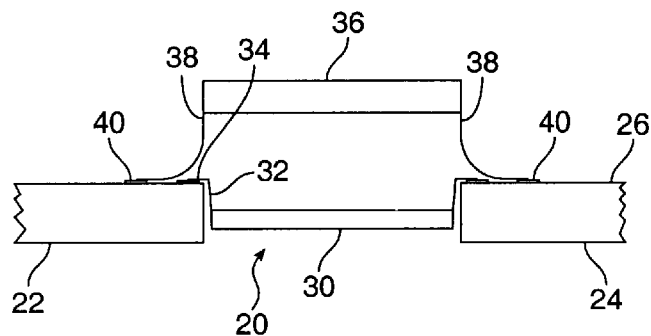
FIG. 8 is a diagrammatic view of another presently preferred embodiment of the present invention.

Another embodiment of the present invention is illustrated in FIG. 8, in which like reference numerals designate like parts. In this embodiment, the first package 20 is located in the opening 28, and has leads 32 electrically connected to connection pads 34 disposed adjacent the opening 28. In addition, the second package is located over the opening 28, and is electrically connected to the surface 26 of the board 22 around the opening 28 by corresponding leads 38 and connection pads 40.

Figure 9:
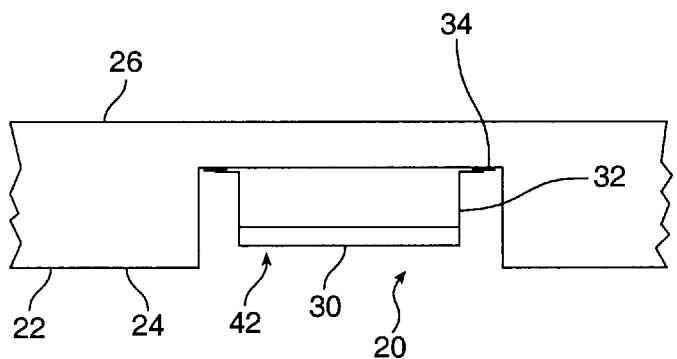
FIG. 9 is a diagrammatic view of yet another presently preferred embodiment of the present invention.

Another embodiment of the present invention is illustrated in FIG. 9, in which like reference numerals designate like parts. In this embodiment, the cavity 42 defines an inner surface of the board 22, and leads 32 of the first package 20 are connected to corresponding connection pads 34 on the inner surface of the cavity 42, with the first package 20 being at least partially received in the cavity 42.

Figure 10:
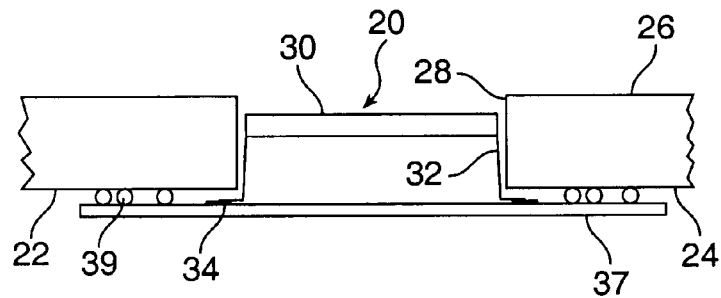
FIG. 10 is a diagrammatic view of yet another presently preferred embodiment of the present invention.

Another embodiment of the present invention is illustrated in FIG. 10, in which like reference numerals designating like parts. In this embodiment, the assembly has a second printed circuit board 37 which is larger than the dimensions of the opening 28. As shown, the second board 37 is electrically connected to the surface 24 of the first board 22, in any suitable manner, such as beads 39 of solder. The first package 20 has a plurality of leads 32 electrically connected to connection pads 34 on a surface of the second board 37 facing the surface 24 of the first board 22. As shown, the first package 20 is at least partially received in the cavity 28.

Figure 11:
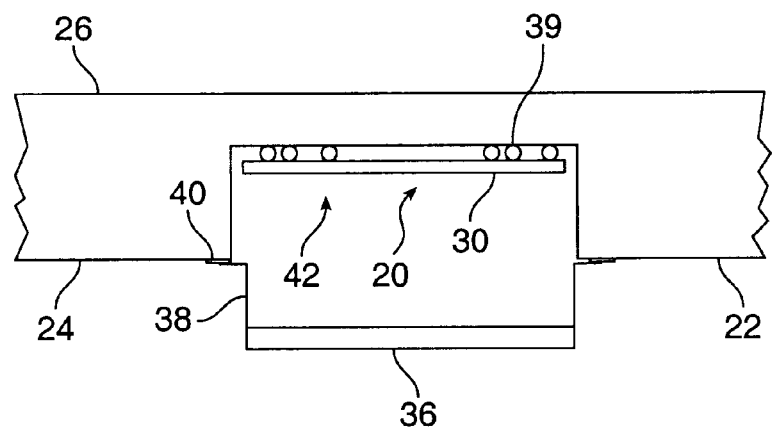
FIG. 11 is a diagrammatic view of yet another presently preferred embodiment of the present invention.

Another embodiment of the present invention is illustrated in FIG. 11, in which like reference numerals designate like parts. In this embodiment, the first package 20 is received in the cavity 42, and is electrically connected to an inner wall of the cavity 42 in any suitable manner, such as by beads 39 of solder. The second package 36 is disposed over the cavity 42, and has leads 38 connected to connection pads 40 on the outer surface 24 of the board 22 peripherally around then cavity 42. In this embodiment, the second package 36 is located outside the cavity 42.

Figure 12:
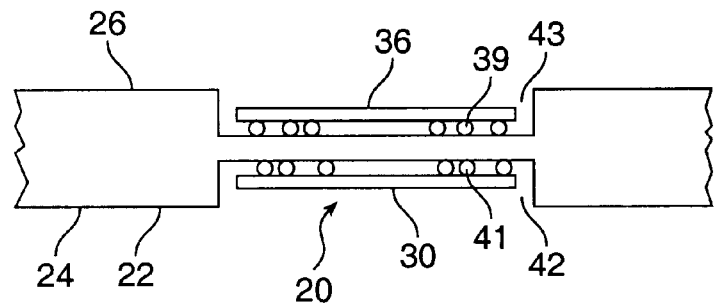
FIG. 12 is a diagrammatic view of yet another presently preferred embodiment of the present invention.

Another embodiment of the present invention is illustrated in FIG. 12, in which like reference numerals designate like parts. In this embodiment, the board 22 has a pair of opposed cavities 42 and 43. The first package 20 is received in the cavity 42, and is electrically connected to an inner wall of the cavity 42 in any suitable manner, such as by beads 41 of solder. The second package 36 is received in the cavity 43, and is electrically connected to an inner wall of the cavity 43, in any suitable manner, such as by beads 39 of solder.

Figure 7:
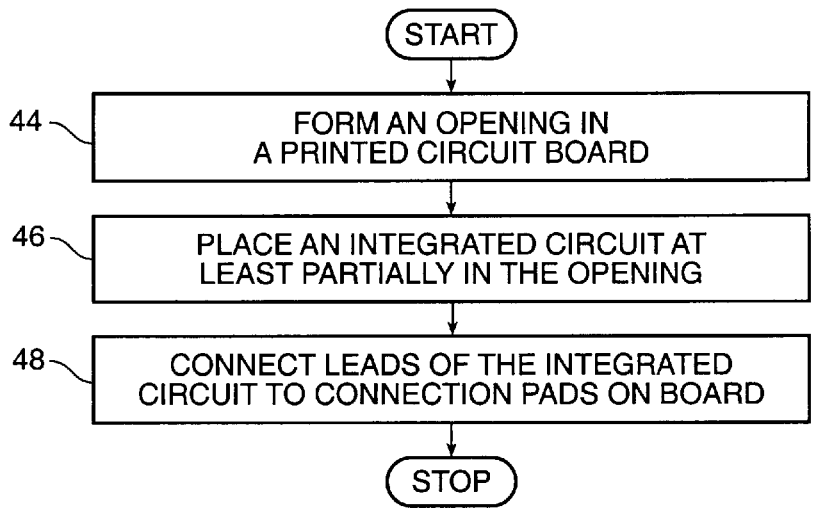
FIG. 7 is a flow chart illustrating a method in accordance with a presently preferred embodiment of the present invention.

A flow chart in FIG. 7 illustrates a method according to a presently preferred embodiment of the present invention. As shown in block 44, an opening is formed in a printed circuit board. As shown in block 46, an integrated circuit package is placed at least partially in the opening of the board. As shown in block 48, the leads of the integrated circuit package are then connected to connection pads adjacent the opening in the board.

It should be noted that the integrated circuit packages mounted in accordance with the teachings of the present invention are preferably of relatively low power dissipation as the removal of printed circuit board material in the area of the opening will reduce the ability of the printed circuit board and surrounding system cooling to dissipate heat generated in the hidden integrated circuit package.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A printed circuit board assembly, comprising:
    a printed circuit board having first and second opposed outer surfaces, an opening extending from said first outer surface, wherein said opening extends completely between said first and second opposed outer surfaces of said printed circuit board, and a plurality of first connection pads disposed on said first outer surface adjacent to said opening;
    a first integrated circuit package received at least partially in said opening, and having a plurality of leads connected to corresponding ones of said plurality of first connection pads on said first outer surface; and
    a second integrated circuit package disposed at least partially in said opening, said second integrated circuit package having a plurality of leads connected to corresponding second connection pads on said second opposed outer surface of said printed circuit board adjacent said opening, wherein said first integrated circuit package is located intermediate said opposed surfaces, and said second integrated circuit package has at least a portion located outside said opening.

2. A printed circuit board assembly, comprising:
    a printed circuit board having first and second opposed outer surfaces, an opening extending from said first outer surface, wherein said opening extends completely between said first and second opposed outer surfaces of said printed circuit board, and a plurality of first connection pads disposed on said first outer surface adjacent to said opening;
    a first integrated circuit package received at least partially in said opening, and having a plurality of leads connected to corresponding ones of said plurality of first connection pads on said first outer surface; and a second integrated circuit package having a plurality of leads connected to corresponding second connection pads on said second opposed outer surface of said printed circuit board adjacent said opening, wherein said first integrated circuit package is located intermediate said opposed surfaces, and wherein said second integrated circuit package is located outside said opening.

3. The assembly of claim 2 wherein said second integrated circuit package is located over said first integrated circuit package.

4. A printed circuit board assembly, comprising:

a printed circuit board having first and second opposed outer surfaces, an opening extending from said first outer surface, and a plurality of first connection pads disposed on said first outer surface adjacent to said opening;

a first integrated circuit package received at least partially in said opening, and having a plurality of leads connected to corresponding ones of said plurality of first connection pads on said first outer surface, wherein said opening extends completely between said first and second opposed outer surfaces of said printed circuit board, and;

a second integrated circuit package disposed at least partially in said opening, said second integrated circuit package having a plurality of leads connected to corresponding second connection pads on said second opposed outer surface of said printed circuit board adjacent said opening, wherein said first integrated circuit package is located intermediate said opposed surfaces, and said second integrated circuit package has at least a portion located outside said opening.

5. A printed circuit board assembly, comprising:

a printed circuit board having first and second opposed outer surfaces, an opening extending from said first outer surface, and a plurality of first connection pads disposed on said first outer surface adjacent to said opening;

a first integrated circuit package received at least partially in said opening, and having a plurality of leads connected to corresponding ones of said plurality of first connection pads on said first outer surface, wherein said opening extends completely between said first and second opposed outer surfaces of said printed circuit board, and;

a second integrated circuit package having a plurality of leads connected to corresponding second connection pads on said second opposed outer surface of said printed circuit board adjacent said opening, wherein said first integrated circuit package is located intermediate said opposed surfaces, and said second integrated circuit package is located outside said opening.

6. The assembly of claim 5 wherein said second integrated circuit package is located over said first integrated circuit package.

7. A method of forming a printed circuit board assembly, comprising the steps of:

forming a printed circuit board having an opening extending completely between a first outside surface and a second outside surface of said printed circuit board, having a plurality of connection pads disposed on said first surface about a periphery of said opening, and having a plurality of connection pads disposed on said second surface about a periphery of said opening;

placing a first integrated circuit package completely in said opening;

connecting leads of said first integrated circuit package to corresponding ones of said connection pads disposed on said first surface about a periphery of said opening;

placing a second integrated circuit package completely in said opening; and connecting leads of said second integrated circuit package to corresponding ones of said connection pads disposed on said second surface about a periphery of said opening.

8. A method of forming a printed circuit board assembly, comprising the steps of:

forming a printed circuit board having an opening extending completely between a first outside surface and a second outside surface of said printed circuit board, having a plurality of connection pads disposed on said first surface about a periphery of said opening, and having a plurality of connection pads disposed on said second surface about a periphery of said opening;

placing a first integrated circuit package completely in said opening;

connecting leads of said first integrated circuit package to corresponding ones of said connection pads disposed on said first surface about a periphery of said opening;

placing a second integrated circuit package at least partially in said opening; and connecting leads of said second integrated circuit package to corresponding ones of said connection pads disposed on said second surface about a periphery of said opening.

9. The method of claim 8, wherein said second integrated circuit package is located over said first integrated circuit package.

* * * * *